(12) United States Patent
Wang et al.

(10) Patent No.: US 11,476,085 B2
(45) Date of Patent: Oct. 18, 2022

(54) SWITCH MATRIX DESIGN FOR BEAM IMAGE SYSTEM

(71) Applicant: ASML Netherlands B.V., Veldhoven (NL)

(72) Inventors: Yongxin Wang, San Ramon, CA (US); Zhonghua Dong, Sunnyvale, CA (US); Rui-Ling Lai, Chang-Hua (TW)

(73) Assignee: ASML Netherlands B.V., Veldhoven (NL)

( * ) Notice: Subject to any disclaimer, the term of this patent is extended or adjusted under 35 U.S.C. 154(b) by 271 days.

(21) Appl. No.: 16/648,385

(22) PCT Filed: Sep. 14, 2018

(86) PCT No.: PCT/EP2018/074834
§ 371 (c)(1),
(2) Date: Mar. 18, 2020

(87) PCT Pub. No.: WO2019/053174
PCT Pub. Date: Mar. 21, 2019

(65) Prior Publication Data
US 2020/0227229 A1 Jul. 16, 2020

Related U.S. Application Data

(60) Provisional application No. 62/560,122, filed on Sep. 18, 2017.

(51) Int. Cl.
*G01J 1/00* (2006.01)
*H01J 37/244* (2006.01)
*H01L 27/146* (2006.01)

(52) U.S. Cl.
CPC ...... *H01J 37/244* (2013.01); *H01L 27/14609* (2013.01)

(58) Field of Classification Search
CPC ............ H01J 37/244; H01J 2237/2446; H01L 27/14609
See application file for complete search history.

(56) References Cited

U.S. PATENT DOCUMENTS

| 6,137,151 A | 10/2000 | Street |
| 10,163,603 B2 | 12/2018 | Zeidler et al. |

(Continued)

FOREIGN PATENT DOCUMENTS

| CN | 102934526 A | 2/2013 |
| CN | 103176199 A | 6/2013 |

(Continued)

OTHER PUBLICATIONS

First Office Action issued in related Chinese Patent Application No. 201880060398.4; dated Dec. 30, 2021 (14 pgs.).

(Continued)

*Primary Examiner* — Kiho Kim
(74) *Attorney, Agent, or Firm* — Finnegan, Henderson, Farabow, Garrett & Dunner, LLP

(57) ABSTRACT

Systems and methods for implementing a detector array are disclosed. According to certain embodiments, a substrate comprises a plurality of sensing elements including a first element and a second element. The detector comprises a switching element configured to connect the first element and the second element. The switching region may be controlled based on signals generated in response to the sensing elements receiving electrons with a predetermined amount of energy.

20 Claims, 14 Drawing Sheets

(56) References Cited

U.S. PATENT DOCUMENTS

| | | |
|---|---|---|
| 10,535,494 B2 | 1/2020 | Zeidler et al. |
| 11,049,686 B2 | 6/2021 | Zeidler et al. |
| 2006/0274176 A1 | 12/2006 | Guidash |
| 2011/0249791 A1 | 10/2011 | Wang et al. |
| 2013/0009069 A1* | 1/2013 | Okada ............... G01T 1/243 |
| | | 250/370.09 |
| 2013/0163722 A1 | 6/2013 | Okada et al. |
| 2017/0090041 A1 | 3/2017 | Yokoyama et al. |
| 2021/0313137 A1 | 10/2021 | Zeidler et al. |

FOREIGN PATENT DOCUMENTS

| | | | |
|---|---|---|---|
| JP | 2008-546313 T | 12/2008 | |
| JP | 2009-078143 A | 4/2009 | |
| JP | 2010-136283 A | 6/2010 | |
| JP | 2012-080206 A | 4/2012 | |
| JP | 2012-120030 A | 6/2012 | |
| JP | 2013-079927 A | 5/2013 | |
| JP | 2013-132034 A | 7/2013 | |
| JP | 2013-132034 A | 7/2013 | |
| JP | 2013-150304 A | 8/2013 | |
| JP | 2017-067501 A | 4/2017 | |
| JP | 2017-067501 A | 4/2017 | |
| JP | 2017-526142 T | 9/2017 | |
| TW | I556644 B | 11/2016 | |

OTHER PUBLICATIONS

Notice of Reasons for Rejection issued by the Japan Patent Office in related Japanese Patent Application No. 2020-512819; dated Jul. 15, 2021 (7 pgs.).

Notice of Reasons for Rejection issued in related Japanese Patent Application No. 202-512819; dated Feb. 3, 2021 (11 pgs.).

International Search Report for corresponding International Application No. PCT/EP2018/074834, dated Apr. 3, 2019 (7 pages).

Decision for Refusal issued by the Korean Intellectual Property Office in related Korean Patent Application No. 10-2021-7003835; dated Feb. 24, 2022 (8 pgs.).

* cited by examiner

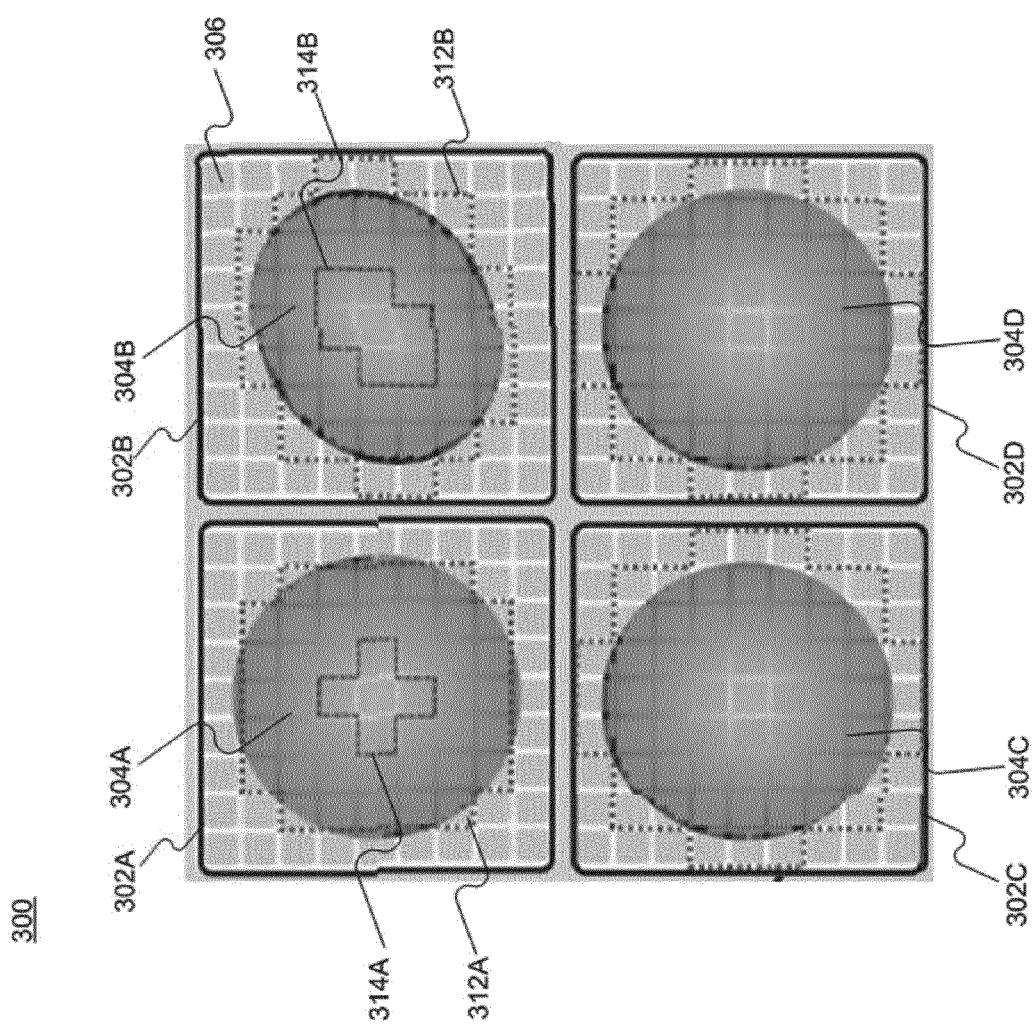

SWITCH MATRIX DESIGN FOR BEAM IMAGE SYSTEM

CROSS-REFERENCE TO RELATED APPLICATIONS

This application is a U.S. national phase entry of International Application No. PCT/EP2018/074834, filed Sep. 14, 2018, and published as WO 2019/053174, which claims the benefit of priority of U.S. provisional application Na 62/560,122 which was filed on Sep. 18, 2017. The contents of these applications are each incorporated herein by reference in their entireties.

TECHNICAL FIELD

The present disclosure generally relates to the field of detector arrays, and more particularly, to a detector array applicable for charged particle detection.

BACKGROUND

Detectors are used in various fields for sensing physically observable phenomena. For example, electron microscopes are useful tools for observing the surface topography and composition of a sample. In a charged particle beam tool used for microscopy, charged particles are directed to a sample and may interact with the sample in various ways. For example, after hitting a sample, secondary electrons, backscattered electrons, auger electrons, x-rays, visible light, etc. may be emitted from the sample and detected by a detector. The scattered particles may form a beam incident on the detector.

Electron beams comprising backscattered electrons and secondary electrons can form one or more beam spots at various locations on a surface of an electron detector. The electron detector can generate electrical signals (e.g., current, voltage, etc.) that represent an intensity of the detected electron beams. The electrical signals can be measured with measurement circuitries (e.g., analog-to-digital converters) to obtain a distribution of the detected electrons. The electron distribution data collected during a detection time window, in combination with corresponding scan path data of the one or more primary electron beams incident on the sample surface, can be used to reconstruct images of the sample structures under inspection. The reconstructed images can be used to reveal various features of the internal and/or external structures of the sample, and can be used to reveal any defects that may exist in the sample.

Imperfections in electron optical sub-systems may degrade the quality of reconstructed images representing the sample. For example, in a case with multiple primary electron beams scanning a sample and where multiple electron beams are emitted by the sample under inspection, due to the effects of aberration and dispersion in the electron optical sub-system, electrons from adjacent beams emitted from the sample may reach the same location of the electron detector surface. As a result, beam spots formed by adjacent electron beams may partially overlap, leading to crosstalk. The effects of crosstalk may be added to the output signals of the electron detector as noise. Thus, output signals of the electron detector may include noise components that do not correlate with a particular sample structure under inspection, and the fidelity of image reconstruction suffers.

Therefore, there is a need for a detector array having flexibility to allow electron sensing element reconfiguration. Application specific integrated circuits (ASICs) may provide flexibility to allow for grouping of active sensing elements. An ASIC may be useful for an electron detector array to allow grouping of active sensing elements corresponding to a particular beam or beamlet spot. Such an ASIC in an electron detector array would require a switching matrix for controlling grouping of the particular sensing elements which are desired to be grouped.

However, a conventional switch matrix may face limitations in manufacturing and practical application due to its complexity. To obtain a high level of flexibility desirable for electron sensing element reconfiguration in an electron detector array, a very complicated switch matrix design would be required. A complicated design is difficult to be scaled up.

SUMMARY

Embodiments of the present disclosure provide systems and methods for charged particle detection. In one embodiment, a detection system is provided. The detection system may comprise a detector.

In some embodiments, a detector may include a substrate having a plurality of sensing elements. Among the sensing elements may be a first element and a second element. The detector may also include a switching element configured to connect the first element and the second element. The first element may be configured to generate a first signal in response to the first element detecting a beam, and the second element may be configured to generate a second signal in response to the second element detecting the beam. The switching element may be configured to be controlled based on the first signal and the second signal.

In some embodiments, a detector may include a sensor layer having an array of sensing elements including a first element and a second element where the first element and the second element are adjacent. The detector may also include a circuit layer having one or more circuits configured to be electrically connected to the first element and the second element. The detector may also comprise a switching element included in the circuit layer. The one or more circuits may be configured to generate a first status indicator when the first element receives charged particles with a predetermined amount of energy, generate a second status indicator when the second element receives charged particles with a predetermined amount of energy, and control the switching element based on the first status indicator and the second status indicator.

In some embodiments, a detector system may include a detector array with a plurality of sensing elements including a first element and a second element, and a switching element configured to connect the first element and the second element. The detector system may also include one or more circuits configured to generate a first signal in response to the first element detecting a beam, and generate a second signal in response to the second element detecting the beam. A controller may be provided that is connected to the one or more circuits.

According to some embodiments, an arrangement can be achieved which eliminates a trade-off relationship between pixel count and increased detector manufacturing difficulties. A detector can be provided such that it can achieve a high pixel count, high flexibility, and without corresponding manufacturing difficulties.

Additional objects and advantages of the disclosed embodiments will be set forth in part in the following description, and in part will be apparent from the description, or may be learned by practice of the embodiments.

Objects and advantages of the disclosed embodiments may be realized and attained by the elements and combinations set forth in the claims. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed embodiments, as claimed.

BRIEF DESCRIPTION OF THE DRAWINGS

FIGS. 3A-3D are diagrams illustrating exemplary surfaces of a detector array, consistent with embodiments of the present disclosure.

DESCRIPTION OF EMBODIMENTS

Figure 1:
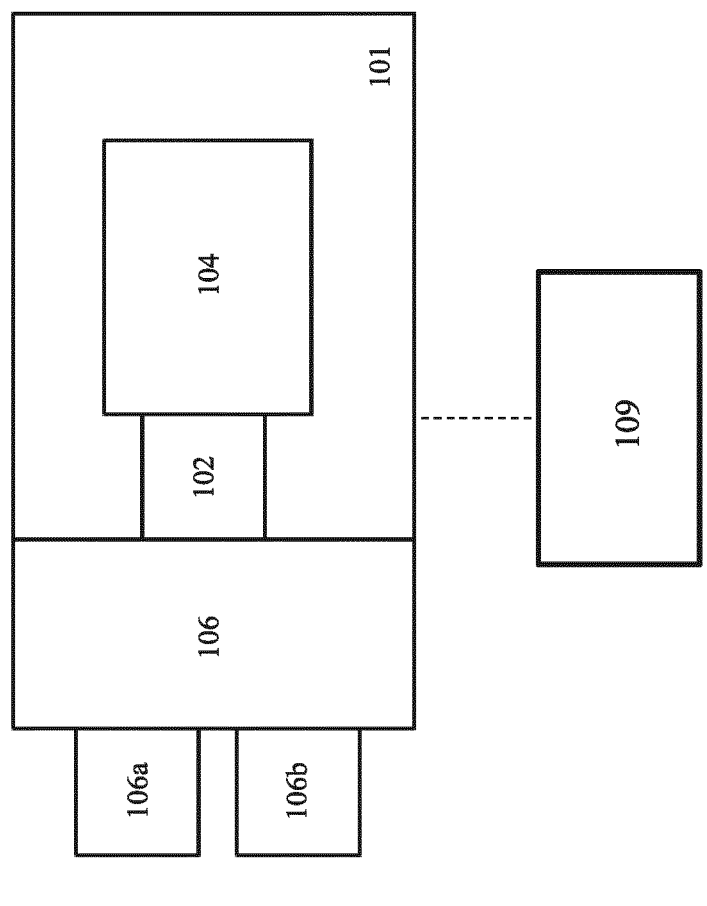
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the subject matter as recited in the appended claims.

Embodiments of the present disclosure provide a detector having an array architecture. The detector may enable field reconfiguration of sensing elements included on an array surface of the detector. The detector may comprise switching elements, such as elements configured to connect pairs of sensing elements. Switching elements can control an electrical connection between the two sensing elements of the pair. Switching elements may comprise switches.

Switches configured to connect two sensing elements can be formed in a switch matrix adjacent a sensing layer of a detector array, where the sensing layer contains the sensing elements. The switch matrix may be configured as an application specific integrated circuit (ASIC) composed of electrical components fabricated with standard device processes. Switches need not be embedded in the sensing layer. Thus, manufacturing of a detector array may be simplified.

Switching elements may comprise any of electrically operated switches. For example, a switch may comprise a relay, a transistor, an analog switch, a solid-state relay, or semiconductor devices capable of connecting or disconnected an electrical circuit. A switch may have an element for operating the switch that is controlled by logical elements.

The sensing elements can form an arbitrary number of groups with arbitrary shapes and an arbitrary number of sensing elements in each group. A control circuit for each switch may be located beside each corresponding switch. The control circuit may comprise logical elements. The switch between pairs of sensing elements can be addressed by row control and/or line control wires. The control circuit and the switches may be contained in a common circuit die.

An array of sensing elements can be formed as a sensor layer in a substrate. The control circuit may be formed as a circuit layer in a substrate. The switching elements may be formed in the circuit layer. Alternatively, the switching elements may be formed as a separate layer sandwiched between the sensing layer and the circuit layer.

In an arrangement consistent with aspects of the present disclosure, interconnections in the circuit layer can be simplified. Output signal of each group of sensing elements can be routed through multiple output wires connected to the group. The output wires, together with connections between sensing elements formed by the switches in the group, can form a network having a low equivalent output serial resistance and serial inductance. For example, in some embodiments, a control circuit may form a network that has reduced equivalent output serial resistance and serial inductance compared to a conventional methods. Output impedance of grouped sensing elements can be reduced such that wide band operation is facilitated.

Embodiments of the present disclosure provide an electron beam tool with an electron detector. A circuit layer may be provided which is coupled with the electron detector. The electron detector can be configured to receive backscattered primary electrons and secondary electrons emitted from a sample. The received electrons form one or more beam spots on a surface of the detector. The surface of the detector can include a plurality of electron sensing elements configured to generate electrical signals in response to receiving the electrons.

In some embodiments, the circuit layer may comprise pre-processing circuitry and signal processing circuitry that are used to configure grouping of the plurality of electron sensing elements. For example, the pre-processing circuitry and signal processing circuitry can be configured to generate indications related to the magnitude of the generated electrical signals. Such circuitry may comprise logic blocks, such as a gate associated with two sensing elements of the plurality of sensing elements. The gate may be configured to determine a connection state based on signals generated from the sensing elements. The gate may be controlled such that the two sensing elements are electrically connected or disconnected via the switching element configured to connect the two sensing elements. Electrical signals generated from the sensing elements may be configured to pass through the switching element. Determinations may be made based on electrical signals from the sensing elements.

Post-processing circuitry may be configured to interact with a controller configured to acquire an image of beams or beamlets based on the output of the sensing elements. The controller may reconstruct an image of the beam. The controller may be configured to determine beam boundaries based on the reconstructed image, for example primary and secondary boundaries of a beam spot.

Further implementations of post-processing circuitry may comprise one or more circuits that can be configured to determine, based on generated indications from the pre-processing circuitry, which of the electron sensing elements lie within a boundary of a beam spot, for example a primary boundary. Processing may be carried out to generate a value representing the intensity of a beam spot based on the determined primary boundary. In some embodiments, a grouping can be used to determine which of the electron sensing elements lie outside the primary boundary of the beam spot. Noise signals may be estimated based on the output of sensing elements determined to be outside the primary boundary. Post-processing circuitry can compensate for the estimated noise signals when generating the intensity data of the beam spot.

Grouping of sensing elements may be based on electrical signals generated by the sensing elements in response to being hit by electrons of an electron beam. Grouping may be based on electrical signals passing through the switching element configured to connect neighboring sensing elements. Grouping may also be based on determinations by post-processing circuitry. For example, in some embodiments, primary and/or secondary beam spot boundaries may be determined based on output signals of the sensing elements.

Local control logic associated with a pixel may generate an indication of the signal level of the corresponding sensing element. This indication can be used to determine whether two adjacent sensing elements should be connected by the switching element. In this manner, groups can be formed. Based on the formed groups of sensing elements, a primary boundary can be determined. Furthermore, in some embodiments, gradient information can be obtained and used to determine a secondary boundary.

Electrons of an incident electron beam may have different properties, e.g., different energy due to different generation processes. Distribution or concentrations of electrons with different properties may vary at different locations. Thus, within an electron beam, an intensity pattern in the detected electron beam spot may correspond to primary or secondary boundaries. Primary and secondary beam spot boundaries can be used to group output signals of corresponding electron sensing elements. The groups can be formed so that their geometrical arrangement matches the pattern of the corresponding electron beam spot. As an example, a portion of the electron beam spot detected by electron sensing elements within the secondary beam boundary may consist almost entirely of backscattered electrons while a portion of the electron beam spot detected by electron sensing elements between the primary and secondary beam boundaries may consist almost entirely of secondary electrons. The formed groups can therefore yield intensity information of the entire detected beam and also the intensity information corresponding to the backscattered and secondary electron portions of the electron beam. Accordingly, some embodiments can provide information about the detected electron beam spots and properties of the sample under investigation.

Reference will now be made in detail to the example embodiments, which are illustrated in the accompanying drawings. Although the following embodiments are described in the context of utilizing electron beams, the disclosure is not so limited. Other types of charged particle beams can be similarly applied. Furthermore, detectors consistent with aspects of the present disclosure are applicable in environments for sensing x-rays, photons, and other forms of energy.

Reference is now made to FIG. 1, which illustrates an exemplary electron beam inspection (EBI) system 100 consistent with embodiments of the present disclosure. As shown in FIG. 1, EBI system 100 includes a main chamber 101 a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples are collectively referred to as "wafers" hereafter).

One or more robot arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robot arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system. A controller 109 is electronically connected to the electron beam tool 104. The controller 109 may be a computer configured to execute various controls of the EBI system.

Figure 2:
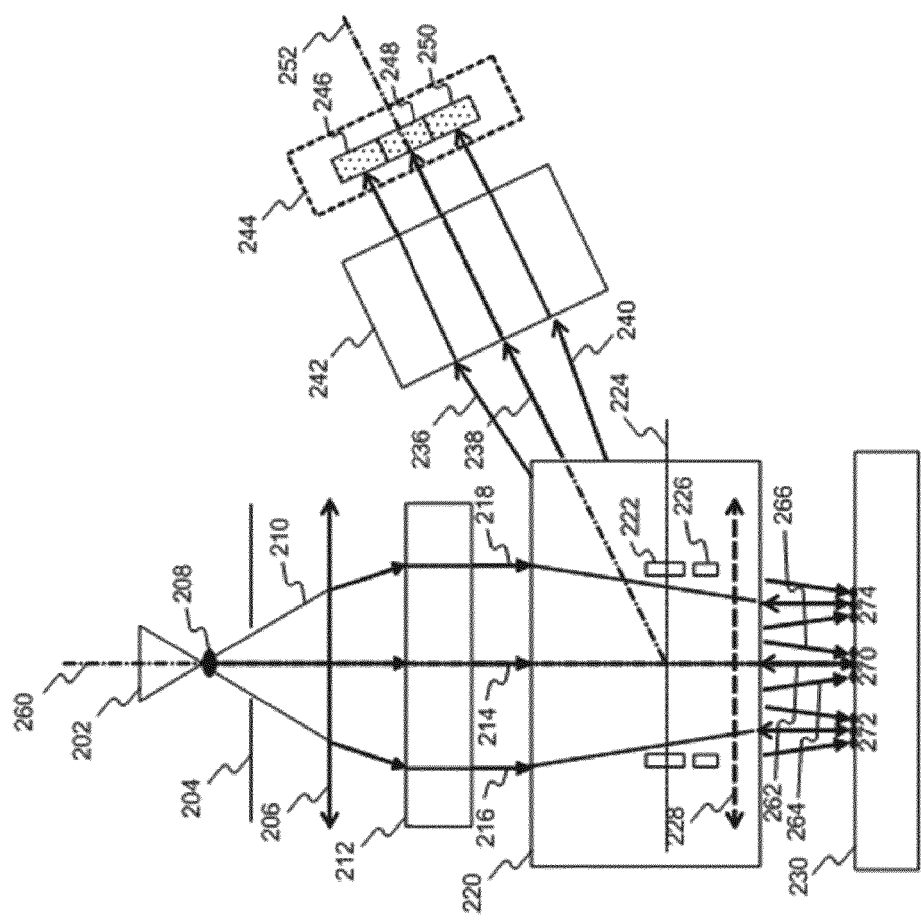
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates an electron beam tool 104 (also referred to herein as apparatus 104) that may be configured for use in a multi-beam image (MBI) system. Electron beam tool 104 comprises an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2), multiple secondary electron beams 236, 238, and 240, a secondary optical system 242, and an electron detection device 244. Primary projection optical system 220 can comprise a beam separator 222, deflection scanning unit 226, and objective lens 228. Electron detection device 244 can comprise detection sub-regions 246, 248, and 250.

Electron source 202, gun aperture 204, condenser lens 206, source conversion unit 212, beam separator 222, deflection scanning unit 226, and objective lens 228 can be aligned with a primary optical axis 260 of apparatus 104. Secondary optical system 242 and electron detection device 244 can be aligned with a secondary optical axis 252 of apparatus 104.

Electron source 202 can comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 can block off peripheral electrons of primary electron beam 210 to reduce Coulomb effect. The Coulomb effect can cause an increase in size of probe spots 270, 272, and 274.

Source conversion unit 212 can comprise an array of image-forming elements (not shown in FIG. 2) and an array of beam-limit apertures (not shown in FIG. 2). The array of image-forming elements can comprise an array of micro-deflectors or micro-lenses. The array of image-forming elements can form a plurality of parallel images (virtual or real) of crossover 208 with a plurality of beamlets 214, 216, and 218 of primary electron beam 210. The array of beam-limit apertures can limit the plurality of beamlets 214, 216, and 218.

Condenser lens 206 can focus primary electron beam 210. The electric currents of beamlets 214, 216, and 218 downstream of source conversion unit 212 can be varied by adjusting the focusing power of condenser lens 206 or by changing the radial sizes of the corresponding beam-limit apertures within the array of beam-limit apertures. Objective lens 228 can focus beamlets 214, 216, and 218 onto a wafer 230 for inspection and can form a plurality of probe spots 270, 272, and 274 on surface of wafer 230.

Beam separator 222 can be a beam separator of Wien filter type generating an electrostatic dipole field and a magnetic dipole field. In some embodiments, if they are applied, the force exerted by electrostatic dipole field on an electron of beamlets 214, 216, and 218 can be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 can also be non-zero. Beam separator 222 can separate secondary electron beams 236, 238, and 240 from beamlets 214, 216, and 218 and direct secondary electron beams 236, 238, and 240 towards secondary optical system 242.

Deflection scanning unit 226 can deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 can be emitted from wafer 230. Secondary electron beams 236, 238, and 240 can comprise electrons with a distribution of energies including secondary electrons (energies ≤50 eV) and back-scattered electrons (energies between 50 eV and landing energies of beamlets 214, 216, and 218). Secondary optical system 242 can focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of surface area of wafer 230.

Figure 3A:
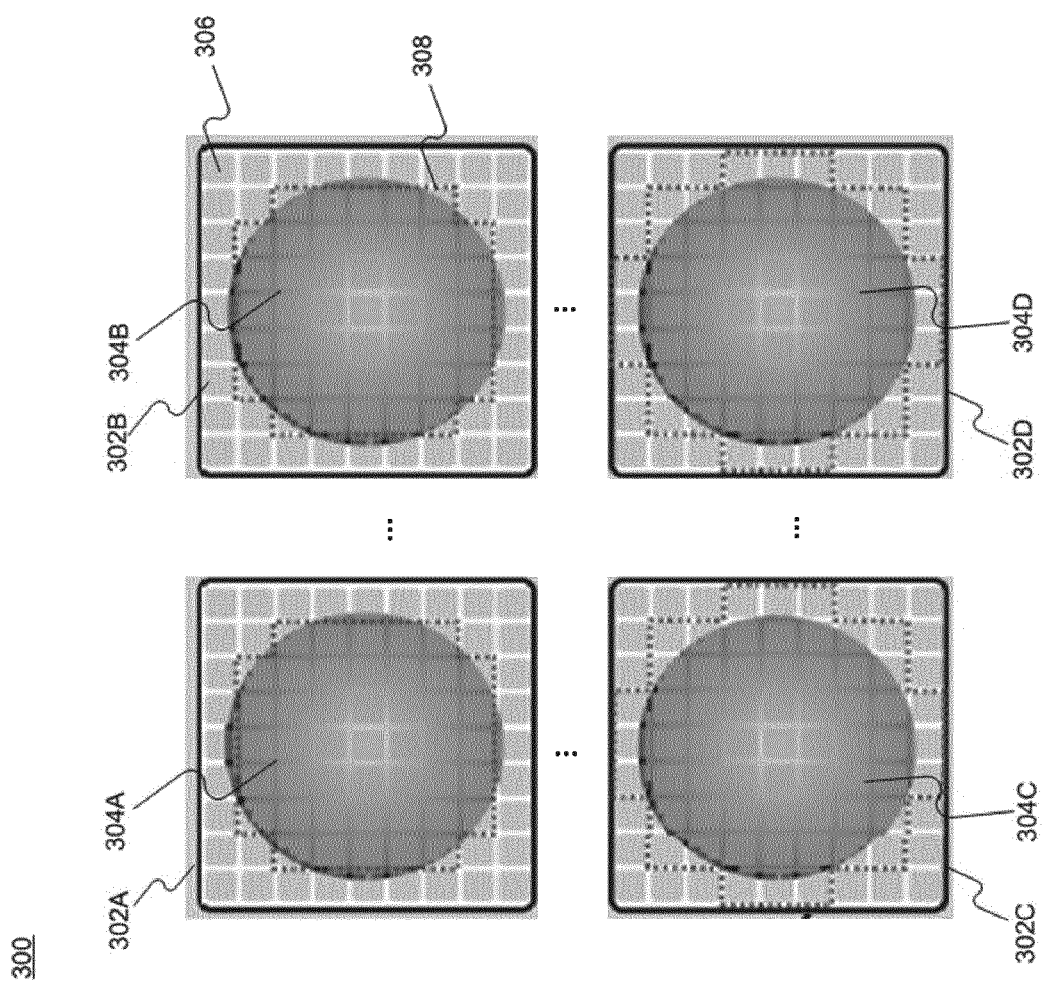

Reference is now made to FIG. 3A, which illustrates an exemplary structure of a sensor surface 300 that can form a detection surface of electron detection device 244. Sensor surface 300 can be divided into four regions 302A-D (2×2 rectangular grid), each region 302 capable of receiving a corresponding beam spot 304 emitted from a particular location from wafer 230. All beam spots 304A-D may exhibit an ideal round shape and have no loci offset. While four regions are displayed, it is appreciated that any plurality of regions could be used. Furthermore, a division of sensor surface 300 into four regions is arbitrary. An arbitrary selection of sensing elements 306 can be taken to form a particular region. Detection sub-regions 246, 248, 250 in detector 244 may be constituted by such regions.

Figure 3C:
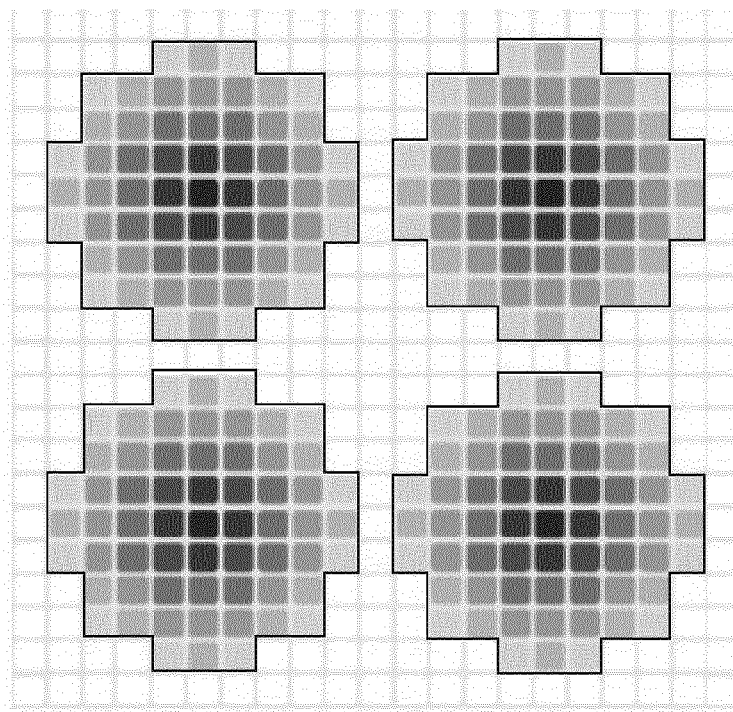

Each sensor region can comprise an array of electron sensing elements 306. The electron sensing elements may comprise, for example, a PIN diode, avalanche diode, electron multiplier tube (EMT), etc., and combinations thereof. Moreover, it is appreciated that while FIG. 3A shows each region 302 being separated from each other as predefined regions having their own sensing elements 306, these predefined regions may not exist, e.g., such as surface sensor 400 of FIG. 3C. For example, instead of having 4 predefined regions each having 81 sensing elements (a 9×9 grid of sensing elements), a sensor surface could have one 18×18 grid of sensing elements, still capable of sensing four beam spots.

Electron sensing elements 306 can generate a current signal commensurate with the electrons received in the sensor region. A pre-processing circuit can convert the generated current signal into a voltage signal (representing the intensity of received electron beam spot). The pre-processing circuit may comprise, for example, a high speed transimpedance amplifier. A processing system can generate an intensity signal of the electron beam spot by, for example, summing the currents generated by the electron sensing elements located within a sensor region, correlate the intensity signal with a scan path data of the primary electron beam incident on the wafer, and construct an image of the wafer based on the correlation.

While electron sensing element 306 is described as receiving electrons from an electron beam, in the case of other types of detectors, a sensor surface may be configured to generate a signal in response to receiving other types of irradiation. For example, a detector may react to charged particles having a particular charge. Also, a detector may be sensitive to flux, spatial distribution, spectrum, or other measurable properties. Thus, a detector sensing element may be configured to generate a signal in response to receiving a certain type or level of energy, for example, electrons having a predetermined amount of energy.

In some embodiments, the processing system can selectively sum the signals generated by some of the electron sensing elements 306 to generate an intensity value of a beam spot. The selection can be based on a determination of which of the electron sensing elements are located within the beam spot.

In some embodiments, the processing system can identify which of the electron sensing elements are located outside a beam spot, and which of the electron sensing elements are located within the beam spot, by identifying a boundary of the beam spot. For example, referring to FIG. 3B, the processing system can identify primary boundaries 312A, 312B and secondary boundaries 314A, 314B for beam spots 304A and 304B, respectively. Primary boundary 312 can be configured to enclose a set of electron sensing elements 306 of which the signal outputs are to be included to determine an intensity of the beam spot.

Secondary boundary 314 can be configured to enclose a center portion of the beam spot, and can be used to provide certain geometric information of the beam spot. The geometric information may include, for example, a shape of the beam spot, one or more loci of the beam spot, etc. Here, the loci may refer to a predetermined location within the beam spot, such as a center. The processing system may also determine primary boundary 312 based on secondary boundary 314.

Moreover, based on the loci information, the processing system can also track a drift in the location of a beam spot 304 due to, for example, imperfections within the electron optics components or the electron optics system. Imperfections may be those introduced during manufacturing or assembling processes. Furthermore, there may be drift introduced during long-term operation of the system. The processing system can update the boundary determinations, and the set of electron sensing elements to be included in the intensity determination, to mitigate the effects of the drifting on the accuracy of intensity determination. Further, the processing system may track shifts in the electron beam spots.

The selection of the electron sensing elements 306 that are used to form each set of electron sensing elements surrounded by primary or secondary boundaries 312 and 314 can be determined by a designated electron collection ratio of each beam spot, which is related to the overall image signal strength and signal to noise ratio, the signal crosstalk of the adjacent electron beams, and the corresponding shape and locus of each electron beam spot. Selection of electron sensing elements may be controlled by processing circuitry located adjacent to the sensing elements or by an external controller, for example. The formation of each set may be static or may vary dynamically. Shape and locus variation information of beam spots may be used, for example, to monitor performance of the electron optical system (e.g., primary projection optical system 220). Information collected regarding the positioning and shape of the beam can be used, for example, in making adjustments to the electron optical system. Accordingly, while FIG. 3B shows beam spot 304B having a shape deviating from a round shape, such types of deviations such as location, shape, and grid information due to drift in the electron optical system or imperfections of the components in the electron optical system can be compensated for.

Figure 3D:
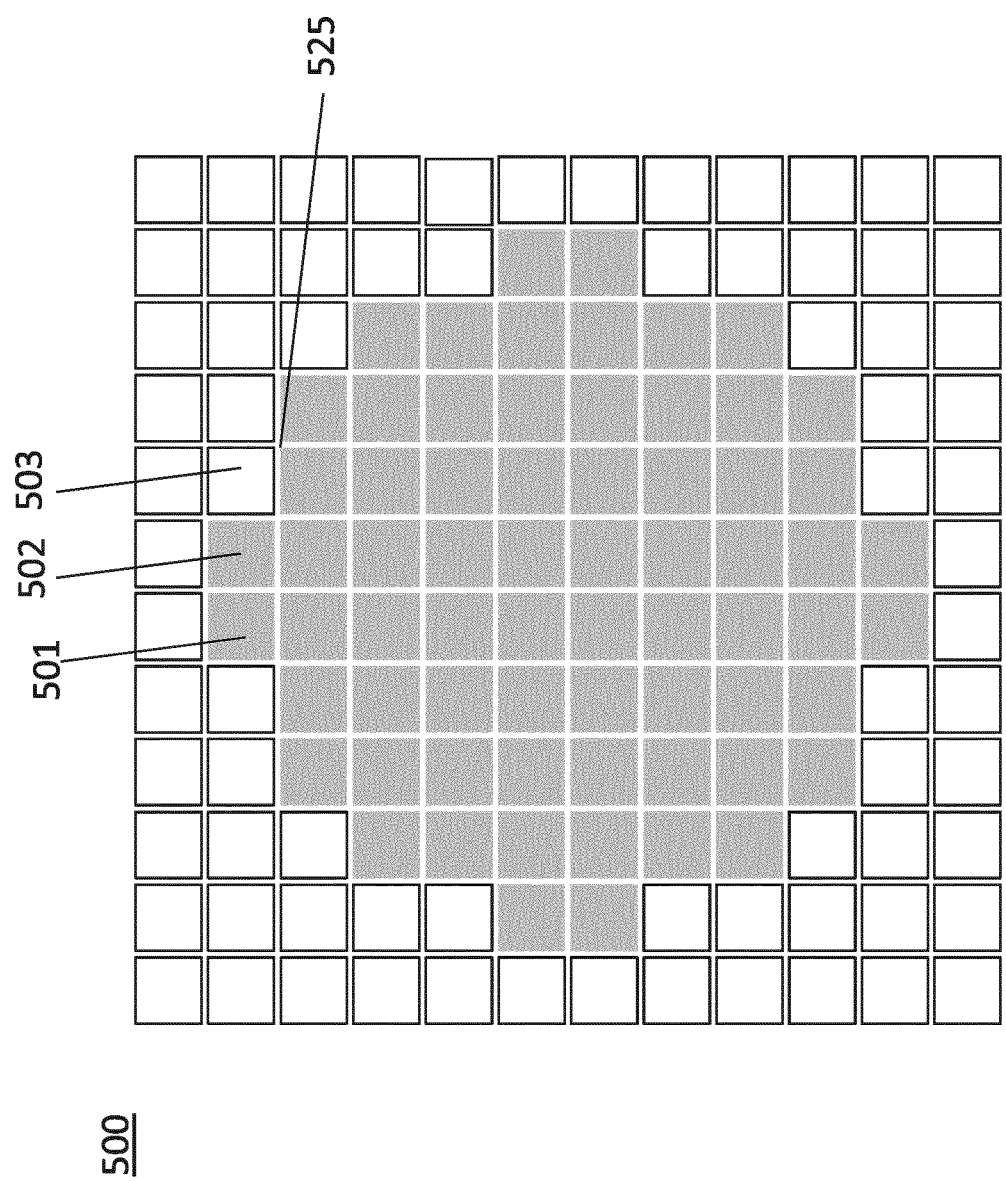

Reference is now made to FIG. 3D, which illustrates an exemplary structure of a sensor surface 500 which can be used on electron detection device 244. Sensor surface 500 has an array structure comprising a plurality of sensing elements, including sensing elements 501, 502, 503, and so on, each capable of receiving at least a part of a beam spot. Sensing elements 501, 502, 503 may be configured to generate an electrical signal in response to receiving energy.

The sensing element may comprise, for example, a PIN diode, avalanche diode, electron multiplier tube (EMT), and the like, and combinations thereof. For example, sensing elements 501, 502, 503 may be electron sensing elements. Electron sensing elements can generate a current signal commensurate with the electrons received in the sensor active area. A processing circuit can convert the generated current signal into a voltage signal (representing the intensity of the received electron beam spot). A processing system can generate an intensity signal of the electron beam spot by, for example, summing the currents generated by the electron sensing elements located within a sensor region, correlate the intensity signal with a scan path data of the primary electron beam incident on the wafer, and construct an image of the wafer based on the correlation.

As shown in FIG. 3D, area 525 may be provided between adjacent sensing elements. Area 525 may be an isolation area to isolate the sides and corners of neighboring pixels from one another.

Although sensor surface 500 is depicted as having a rectangular grid arrangement, various geometric arrangements may be used. For example, sensing elements may be arranged in a hexagonal grid. Accordingly, individual sensing elements may have correspondingly different sizes and shapes. Sensing elements may also be arranged with octagonal tiling, triangular tiling, rhombic tiling, etc. Sensing elements need not be provided as uniform shapes and with regular packing. For example, pentagonal tiling with semi-regular hexagons may be used. It is to be understood that these examples are exemplary, and various modifications may be applied.

Figure 4A:
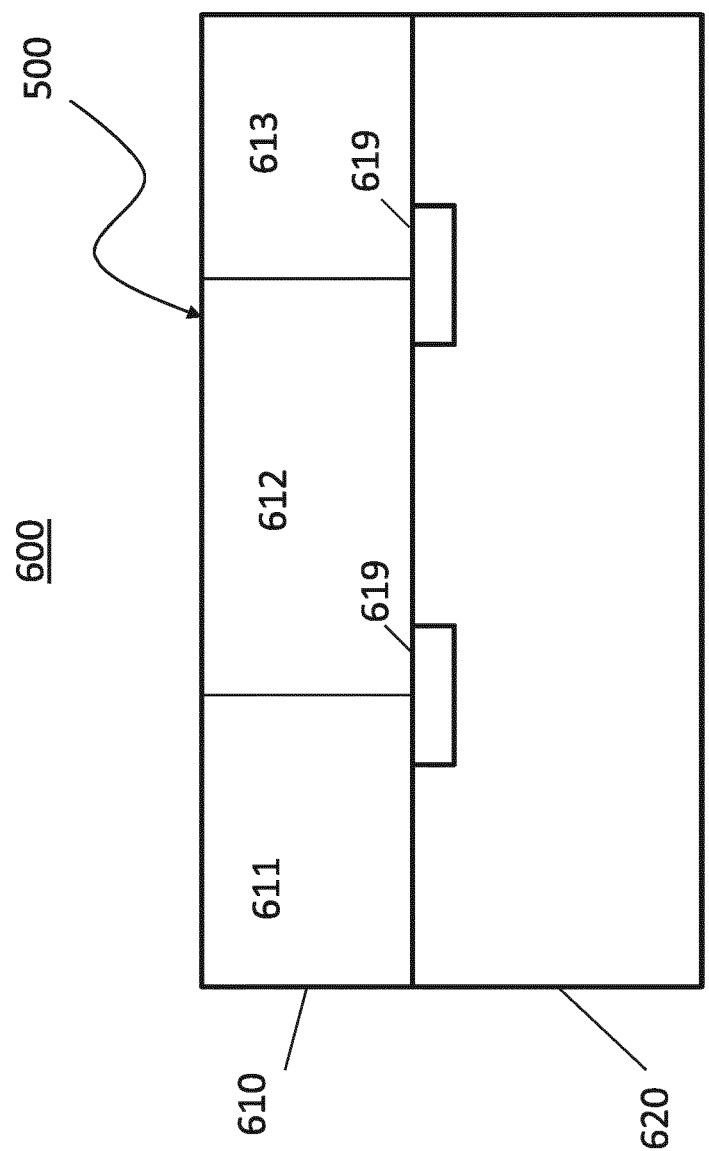
FIGS. 4A-4C are diagrams illustrating a cross sectional view of a detector, consistent with embodiments of the present disclosure.

Reference is now made to FIG. 4A, which illustrates a simplified illustration of a layer structure of a detector 600. Detector 600 may be provided as detector 244 as shown in FIG. 2. Detector 600 may be configured to have a plurality of layers stacked in a thickness direction, which may be substantially parallel to an incidence direction of an electron beam. The plurality of layers may include a sensor layer 610 and a circuit layer 620. Sensor layer 610 may be provided with sensor surface 500, as described above. Sensing elements, for example sensing elements 611, 612, and 613 may be provided in sensing layer 610. Switching elements 619 may be provided arranged between adjacent sensing elements in the cross sectional direction.

For example, each of sensing elements 611, 612, and 613 may be configured as diodes. Furthermore, switching elements 619 may be configured as transistors, such as a MOSFET. Each of sensing elements 611, 612, 613 may comprise outputs for making electrical connections to circuit layer 620. Outputs may be integrated with switching elements 619, or may be provided separately. Outputs may be integrated in a bottom layer of sensor layer 610 which may be a metal layer.

Figure 4B:
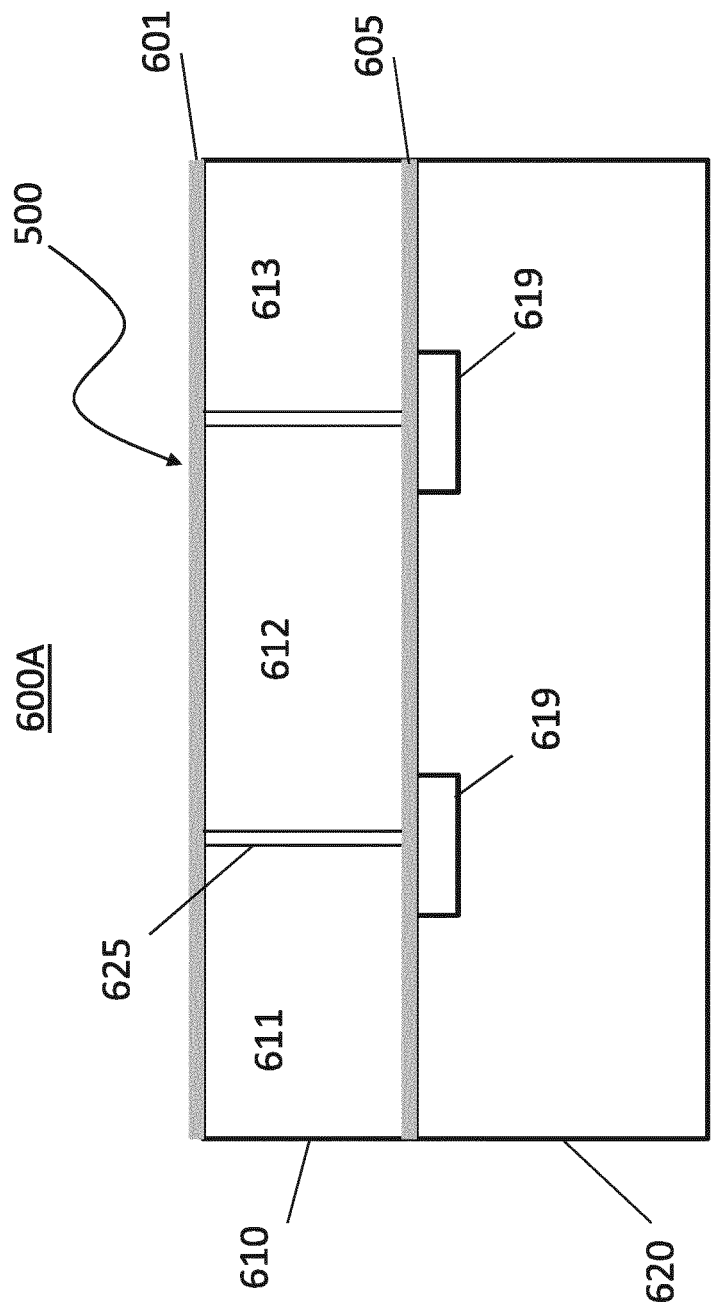

In one example, as illustrated in FIG. 4B, sensing elements 611,612, 613 may be configured as PIN diodes. A detector device 600A may include semiconductor devices. For example, a semiconductor device constituting a PIN diode device may be manufactured as a substrate with a plurality of layers. Additionally, sensing elements 611, 612, 613, and/or switching elements 619 may be configured as a plurality of discrete semiconductor devices. The discrete semiconductor devices may be configured to be directly adjacent each other.

Detector device 600A may comprise a metal layer 601 as a top layer. Metal layer 601 is a layer for receiving electrons incident on the electron detection device 244. Thus, metal layer 601 is configured as a detection surface. A material of metal layer 601 may be aluminum, for example. When aluminum is used in metal layer 601, an oxidized layer may be formed on the exterior of the surface so as to protect electron detection device 244. Detector device 600A may also comprise metal layer 605 as a bottom layer of sensor layer 610. A material of metal layer 605 may be copper, for example. Metal layer 605 may comprise output lines for carrying induced current from each of the sensing elements 611, 612, 613. Individual sensing elements 611, 612, 613 may be separated by area 625 in the cross sectional direction, where area 625 may be an isolation area.

In operation of a PIN diode device that may constitute sensing element 611, for example, a P+ region is formed adjacent to metal layer 601. P+ region may be a p-type semiconductor layer. An intrinsic region is formed adjacent to P+ region. Intrinsic region may be an intrinsic semiconductor layer. An N+ region is formed adjacent to intrinsic region. N+ region may be an n-type semiconductor layer. Thus, the intrinsic region is sandwiched between the P+ region and N+ region. When electrons are incident on the top surface of metal layer 601, the intrinsic region is flooded with charge carriers from P+ region. Thus, the area under metal layer 601 in the region irradiate will be activated.

A sensor layer of electron detection device 244 may be formed as the layers of metal layer 601, metal layer 605, and the various P+ regions, intrinsic regions, and N+ regions contained in sensing elements.

Circuit layer 620 is provided adjacent to sensor layer 610. Circuit layer 620 comprises line wires and various electronic circuit components. Circuit layer 620 may be provided as a semiconductor device. Circuit layer 620 may also comprise a processing system. Circuit layer 620 may be configured to receive the output current detected in sensor layer 610.

While the above descriptions discuss a metal or metal layers, it is apparent that alternatives could be used, for example, a conductive material.

Figure 4C:
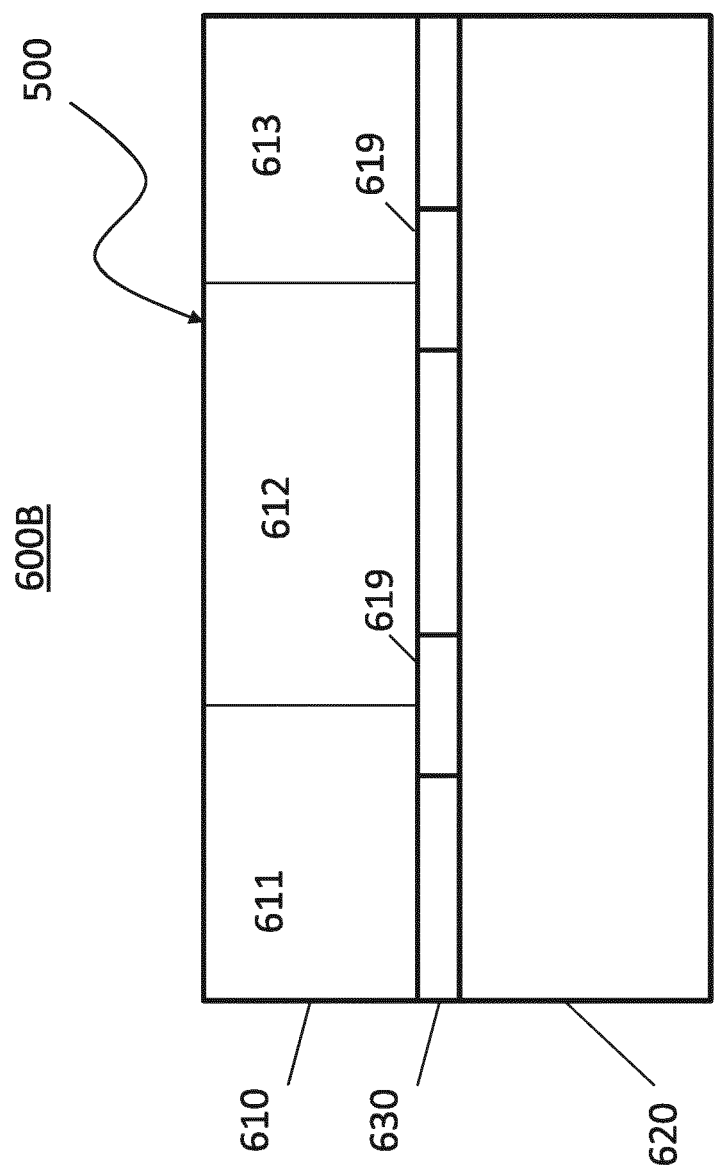

In some embodiments, switching elements 619 may be formed in a separate die. As illustrated in FIG. 4C, for example, a switch die 630 is provided. Switch die 630 comprises the plurality of switching elements 619. Switch die 630 is sandwiched between sensor layer 610 and circuit layer 620. Switch die 630 is electrically connected to sensor layer 610 and circuit layer 620.

Figure 5A:
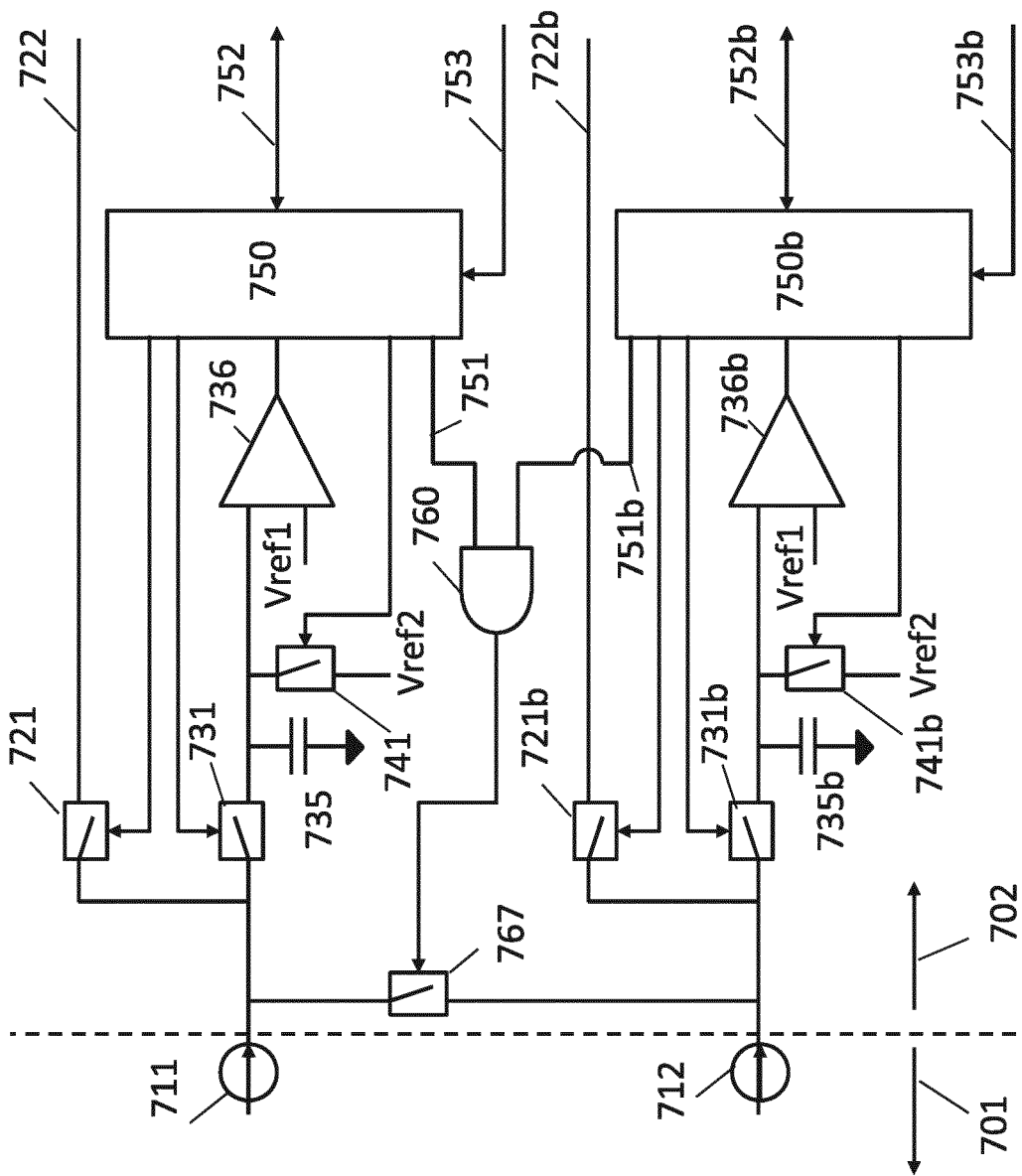
FIGS. 5A and 5B are circuit diagrams illustrating a sensor layer and circuit layer of a detector, consistent with embodiments of the present disclosure.

A circuit schematic is shown in FIG. 5A. A dashed line represents a division between a sensor die 701 and a circuit die 702. A layout such as that shown in circuit die 702, for example, may represent a circuit provided in circuit layer 620. A layout such as that shown in sensor die 701, for example, may represent a plurality of sensing elements. For example, sensor layer 610 may be configured in a sensor die.

Figure 5B:
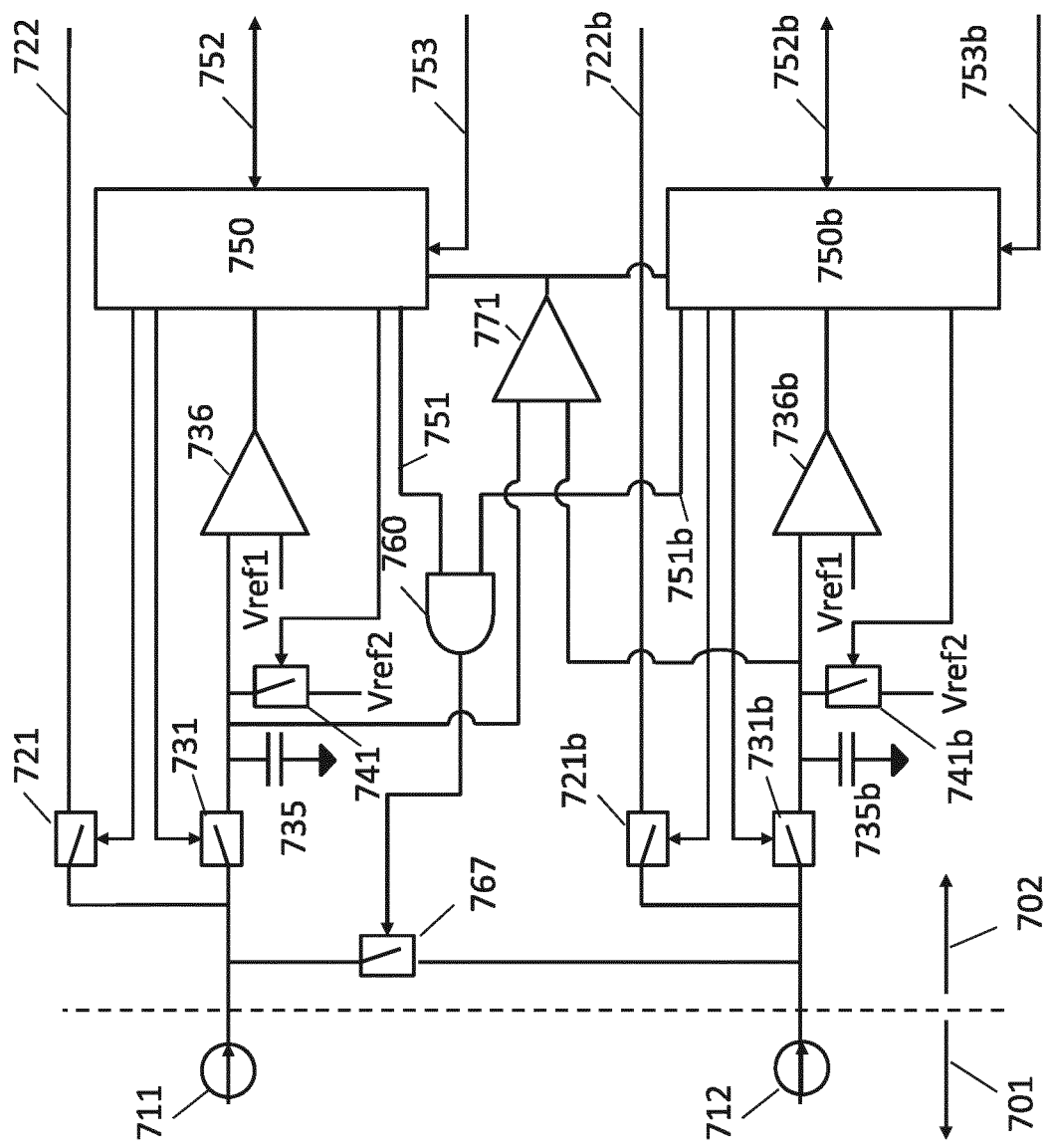

A further circuit schematic is shown in FIG. 5B. A layout shown in circuit die 702 may include an additional comparator 771, as shall be discussed later.

Figure 6:
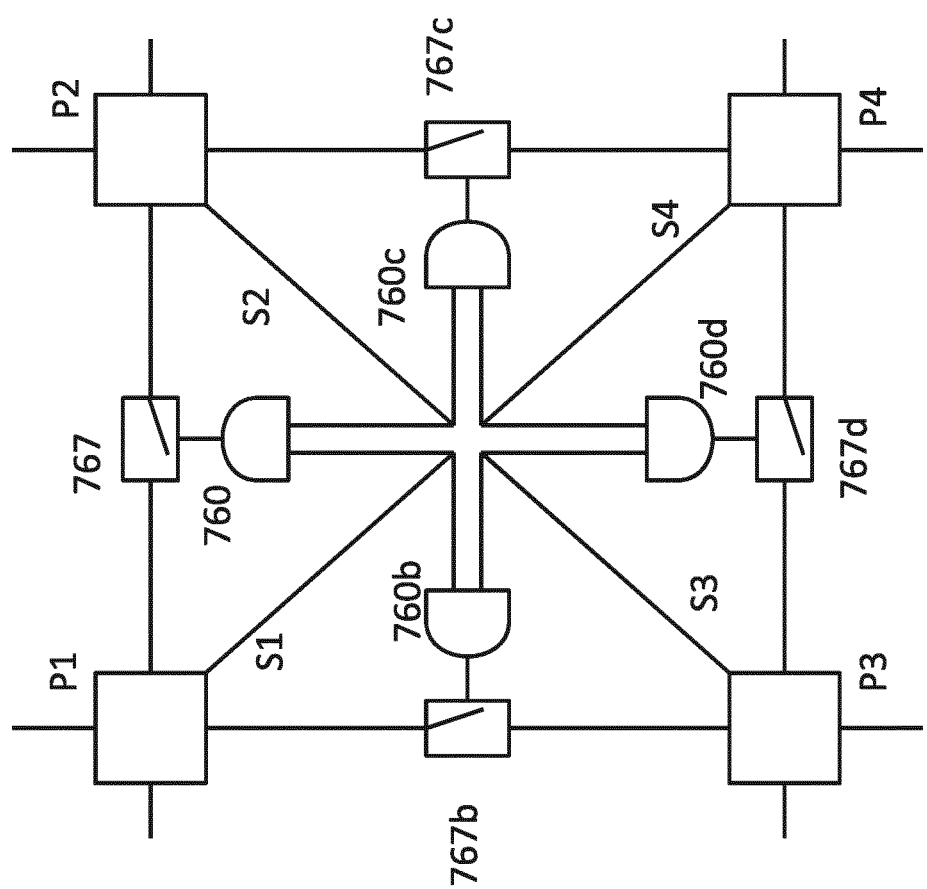
FIG. 6 is a simplified circuit schematic diagram illustrating an exemplary detector array, consistent with embodiments of the present disclosure.

A simplified circuit diagram is shown in FIG. 6. As shown in FIG. 6, a plurality of pixels P1, P2, P3, P4 may be provided. Pixels P1, P2, P3, P4 may represent pixels of a sensing array, each of which may be associated with a sensing element.

In an exemplary process of detecting signal intensity from a sensing element, a sensing element in a sensor layer is configured to gather current induced by incident charged particles. Other types of energy conversion may be used. Current is output from the sensing element to a circuit layer configured to analyze the output from the sensing element. The circuit layer may comprise a wiring layout and a plurality of electronic components to analyze the output from the sensing element.

A process of signal intensity detection will be discussed with reference to FIG. 5A. One pixel may be associated with one sensing element of a sensing element array. Thus, a first pixel is configured to generate a PIN diode current 711. At the start of a process for PIN diode signal intensity detection, a switch 721 and a switch 731 are set to be open, while a switch 741 is set to be closed. Thus, voltage of a capacitor 735 can be reset to Vref2.

Next, switch 721 and switch 741 are set to be open, while switch 731 is set to be closed. In this state, capacitor 735 begins charging and generates a voltage. Capacitor 735 may be configured to charge for a predetermined period of time, for example t_charge, after which switch 731 is set to be open.

Then, comparator 736 compares the voltage at capacitor 735 to a reference value Vref1. Reference value Vref1 may be set as a predetermined signal level. Based on the reference value, a circuit may be configured to output a signal that indicates that the sensing element is gathering current from an incident electron beam. Thus, the reference value may be a suitable value that indicates that the signal level from the PIN diode is high enough to be considered to be gathering current from an incident electron beam included within a beam spot. In comparator 736, if voltage from capacitor 735 is higher than Vref1, an output signal is sent to block 750.

Vref1 can be set so that each sensing element can be controlled to be included within an outer boundary of a beam spot. The value t_charge can be determined based on local logic or an external circuit, for example through a data line 752 communicating with block 750. Logic blocks and circuitry components may be set so that functions such as signal intensity detection and pixel grouping determination can occur locally. However, signal intensity of each sensing element can be collected and determinations can be made via an external path. For example, an analog signal path and ADC may communicate with an external controller via an analog signal line and a data line.

As described herein, each pixel in a sensing array may be associated with a sensing element that generates current based on incident electrons on the sensing element, and communicates with a circuit layer. Pixels may be connected to circuitry such as that discussed above with reference to the first pixel configured to generate PIN diode current 711. Thus, a second pixel may be configured to generate a PIN diode current 712, and so on. PIN diode current 712 may be connected to corresponding circuit elements, for example, switch 721b, switch 731b, switch 741b, capacitor 735b, comparator 736b, block 750b, etc.

Generation and setting of a status indicator will be discussed, again with reference to FIG. 5A. Using the output current from the sensing element, the circuit layer is configured to generate a status indicator. The status indicator may be configured to trigger a function for implementing grouping of pixels. Various methods for achieving sensing element grouping can be provided.

In a first method for grouping, sensing element grouping may be achieved according to a signal strength flag in a local logic circuit. If a first pixel and a second pixel have a strong signal strength, the two pixels may be grouped. For example, PIN diode current 711 and PIN diode current 712 may both have high current values. Namely, voltage at capacitor 735 and voltage at capacitor 735b may both be higher than Vref1. Then, a switch 767 is set to be closed so as to merge the two pixels.

If at least one of the first pixel and the second pixel has a weak signal, that is, either voltage at capacitor 735 or capacitor 735b is less than Vref1, switch 767 is set to be open so that the two pixels are not merged.

Switch 767 is configured as an element to implement a switch between two sensing elements. Switch 767 is located in circuit die 702. Switch 767 may be configured as a transistor, such as a MOSFET. Switch 767 may also be configured as a relay, an analog switch, a solid-state relay, or other semiconductor devices.

Switch 767 may be triggered by local logic in the circuit die 702. Output from comparator 736 and output from comparator 736b may be routed to a block for activating switch 767. For example, as illustrated in FIG. 5A, an AND gate 760 is provided. AND gate 760 is arranged in circuit die 702. AND gate 760 is associated with two pixels, and is associated with one switch between the two pixels. Output from comparator 736 and 736b may be routed, directly or through other blocks, to AND gate 760. Based on signals input to AND gate 760, for example status indicator 751 and status indicator 751b, AND gate 760 is configured to toggle switch 767. When switch 767 is a transistor, such as a field effect transistor, the switch may be toggled by application of voltage to its gate. A gate of the transistor may be arranged such that at least a contact of the gate is embedded in metal layer 605. Thus, in the configuration of FIG. 4B, for example, voltage may be applied to a gate having a contact located in metal layer 605. Additionally, in the configuration of FIG. 4C, for example, metal layers may be provided on a top and bottom of switch die 630. In this configuration, a gate of the transistor switch may be arranged such that at least a contact of the gate is embedded in the metal layer on the bottom of switch die 630.

While an AND gate is illustrated, it should be appreciated that various components may be used to achieve controlling a switch between sensing elements based on output signals from the sensing elements. For example, FIG. 6 is a simplified circuit diagram illustrating an arrangement of four pixels in an array. In the array, a first pixel P1 may be configured to generate a PIN diode current 711, and output a status signal S1 based thereon. Status signal S1 may correspond to status indicator 751. A second pixel P2 may be configured to generate PIN diode current 712, and output a status signal S2 based thereon. Status signal S2 may correspond to status indicator 751b. Status signal S1 from first pixel P1 and status signal S2 from second pixel P2 are input to an AND gate 760. Status signal S1 and status signal S2 can be generated based on signals generated at each of pixel P1 and pixel P2, for example, a current signal may be induced by electrons incident on the surface of the pixel. Status signal S1 may be generated based on whether current at pixel P1 reaches a predetermined threshold. Similarly, status signal S2 may be generated based on whether current at pixel P2 reaches a predetermined threshold. AND gate 760 outputs a signal based on status signal S1 and status signal S2 to switch 767. Thus, switch 767 is configured to be controlled based on input signals generated from at least two pixels. Such an input signal may be a voltage. It will be apparent that various other blocks or electrical components could be used to achieve control of switch 767.

Similar components may be provided for other pixels of the array. For example, a switch 767d is provided between pixel P3 and pixel P4. Pixel P3 and pixel P4 may be configured to output status signals S3 and S4, respectively, similar to pixels P1 and P2. Furthermore, a pixel may be in communication with multiple other pixels. For example, in addition to switch 767 configured to connect pixels P1 and P2, a switch 767b may be provided between pixels P1 and P3, and so on. Status signal S1 may be configured to be sent to multiple neighboring pixels.

In a second method for grouping, sensing element grouping may be achieved according to external logic circuits. For example, in FIGS. 5A and 5B, block 750 may be a digital logic block. Block 750 may communicate with external components via data line 752 and an address signal 753. Status indicator 751 can be overwritten by external logic circuitry via data line 752 to control the status of switch 767. Such external logic circuitry may also be provided in circuit die 702, or may be provided as a separate system attached to block 750 by an input/output device.

In some embodiments, local control logic associated with each pixel generates an indication of signal level of its corresponding sensing element. This indication can be used to determine whether two adjacent sensing elements should be connected by the switch configured to connect them. In this way, groups of sensing elements can be formed. Based on the formed groups, a primary boundary can be formed.

To generate gradient information on signal intensity, additional comparator 771 may be provided, as shown in FIG. 5B. A result from comparator 771 can be fed to logic blocks 750 and 750b. With an arrangement including comparator 771, processing may be carried out to generate a value representing the intensity of a beam spot based on the determined primary boundary. Grouping can be carried out based on which electron sensing elements are determined to lie outside the primary boundary of the beam spot.

In electron beam imaging, beamlet image acquisition may be carried out. A process of image acquisition will be discussed with reference to FIG. 5A. Initially, switch 721 and switch 731 are set to be open, while switch 741 is set to be closed. For each row of a detector array, switch 721 (or a corresponding switch) is set to be closed, one-by-one. By sequentially closing switch 721 and corresponding switches, electronic scanning of a detector surface can be carried out. Scanning may be implemented to read the analog signal of each pixel. For example, analog output line 722 may be configured to be read by an analog path, output to external devices, or sent to an analog-to-digital converter (ADC).

Based on signals output from analog output line 722, image reconstruction of beams or beamlets can be achieved. A controller may be used to conduct image acquisition based on the reconstructed image. The reconstructed image can be used to determine the boundary of a group of sensing elements. For example, one group can be defined to correspond to one beamlet. Summed signal intensity of the sensing elements in the group is thus representative of the current of the one beamlet. The reconstructed image can also be used to evaluate the performance of the electron optical system. For example, primary projection optical system 220 and/or secondary optical system 242 may be adjusted based on the reconstructed image. The reconstructed image may be used to compensate for imperfections or drift in electron optical sub-systems.

Moreover, a low impedance output path of current signal from groups of pixels can be achieved. For example, a plurality of switches, such as switch 721, may be provided for a plurality of pixels in the same group. Pixels of the same group may be in close proximity. A plurality of analog signal lines, such as analog output line 722, may be routed to a grouped output. Additionally, the plurality of analog signal lines may be connected when they are grouped to the same group of the plurality of pixels.

For example, switch 767 may be configured to group together a first sensing element and a second sensing element. Accordingly, PIN diode current 711 and PIN diode current 712 may be routed together through circuit die 702. An output signal path for conveying PIN diode current 711 may comprise analog output line 722 and/or other output lines depending on which of switches 721 and 731 are open/closed. The output signal path may be part of the circuit die 702. Output signal paths for grouped sensing elements may be connected via their corresponding switching element.

While an example has been discussed with reference to electron beam inspection systems, it should be noted that for photo image sensor applications, a buffer can be added after switch 721 to improve performance.

In an exemplary embodiment of a detector array, individual sensing elements in the detector array can be enabled or disabled. In normal operation for electron beam imaging, certain sensing elements may be enabled to detect incident beam current.

For example, with reference to FIG. 5A, a pixel may be enabled when voltage at capacitor 735 is greater than or equal to Vref1. A pixel may also be enabled by external logic circuits, for example in an override mode. In override mode, switch 721 may be open or closed depending on a control signal from external logic to decide the signal output routing. In override mode, switch 731 may be set to be open and switch 741 may be set to be closed.

A pixel may be disabled when voltage at capacitor 735 is lower than Vref1. A pixel may also be disabled by external logic circuits, for example in an override mode. In an override mode for disabling, switch 721 may be set to be open. Switch 731 and switch 741 may be set to be closed.

Operation in override modes may be conducted when, for example, it is determined that crosstalk is present in the sensing elements. Crosstalk can occur when a beam partially overlaps with an adjacent beam due to aberration, dispersion, and the like. In some embodiments, a processing system can detect the occurrence of partial overlapping based on primary or secondary beam spot boundaries. The processing system can exclude outputs from some sensing elements that are located in the area where beam spots overlap when determining intensity values of beam spots.

Figure 7:
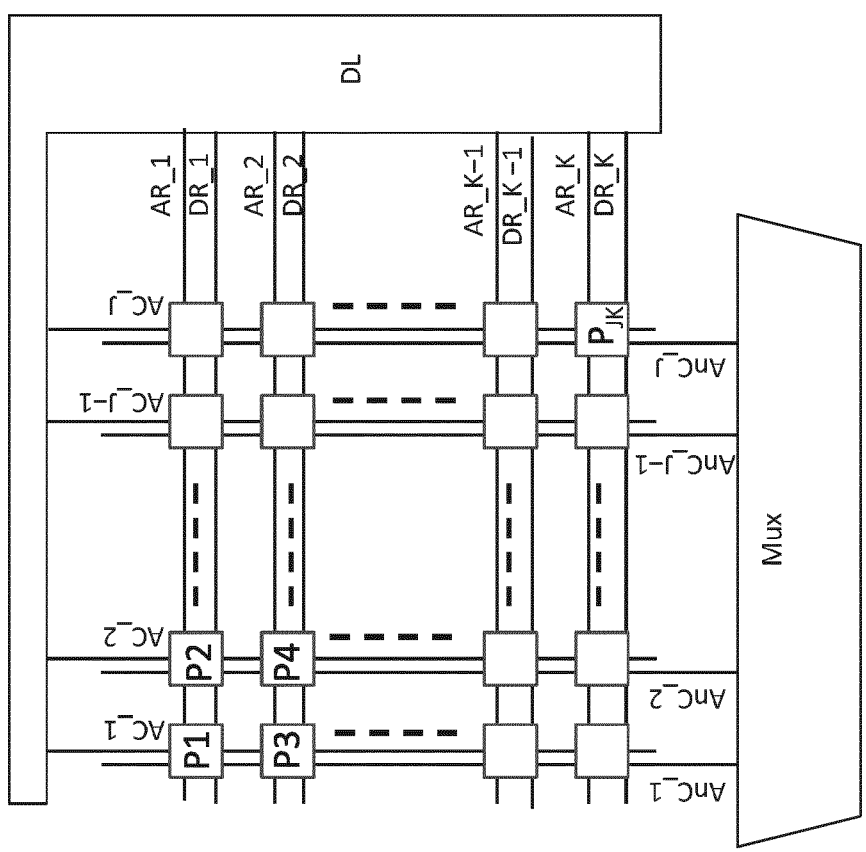
FIG. 7 is a diagram illustrating one or more circuits relating location data of sensing elements, consistent with embodiments of the present disclosure.

Reference is now made to FIG. 7, which illustrates a diagram relating location data of sensing elements. A detector array may comprise a plurality of sensing elements arranged to form J×K pixels having M×N channels. A single sensing element may be represented by pixel P1. Pixel P1 has an address column AC_1. Pixel P2 has an address column AC_2, and so on. For example, in the exemplary array having J×K pixels, pixel $P_{JK}$ has an address column AC_J and an address row AR_K. Each column may have an analog column. For example, pixel P1 has analog column AnC_1, which carries output current from the sensing element of pixel P1.

Each sensing element can be selected by address column and address row signals. For example, pixel P1 may be addressed by AC_1 and AR_1.

Data can be read and written by data row signals to each local logic circuit associated with each sensing element. For example, data can be sent to and received from pixel P1 via data row DR_1. Digital logic DL may control data read/write, etc.

Analog signal from each sensing element may travel through corresponding analog column lines to reach a multiplexer Mux. Multiplexer Mux may be located in the detector array. Multiplexer Mux may also be external to the detector array. Multiplexer Mux may have J inputs and m×N outputs.

Pixels can be identified and grouped by their respective address line information. Any two pixels in a detector array can be in communication. Thus, grouping between any arbitrary number of pixels, in any arbitrary locations, can be achieved.

Location information of the plurality of sensing elements may be used in various ways. For example, location information may be correlated with beam intensity to determine boundaries of beam spots. Additionally, based on the locations of the electron sensing elements that give rise to signal intensity comparator decisions, the processing system can identify a location on the sensor surface where a transition between the intensity gradients occurs. Intensity gradient information can be used for determinations involving primary and secondary boundaries. In some embodiments, location data may also be used to operate in override modes to control switching elements between two pixels independently of local logic.

A processing system, for example, a processor embedded in circuit die 702 or externally connected may perform processing to determine identified locations as part of a beam boundary. The processing system may comprise an arrangement of comparators configured to perform processing based on voltage comparisons for each row and column of electron sensing elements to determine a set of locations on the detector array surface that may make up a beam boundary.

In some embodiments, the processing system can also improve the fidelity of image reconstruction by compensating for the effect of noise signals using boundary information. The processing system can exclude signals received from outputs of electron sensing elements that are determined to be located outside a beam primary boundary. This can improve fidelity of image reconstruction by eliminating the random noise signals from electron sensing elements outside the primary boundary.

In FIG. 7, lines interconnecting a plurality of sensing elements, for example lines illustrated as AC_1, AR_1, DR_1, AnC_1, etc. may be wire lines patterned by printing a conductive material on a substrate. Wire lines can be manufactured in various manners, such as by normal processes used in fabricating a MOSFET. The wire lines may be part of a circuit layer of a detector array.

Figure 8:
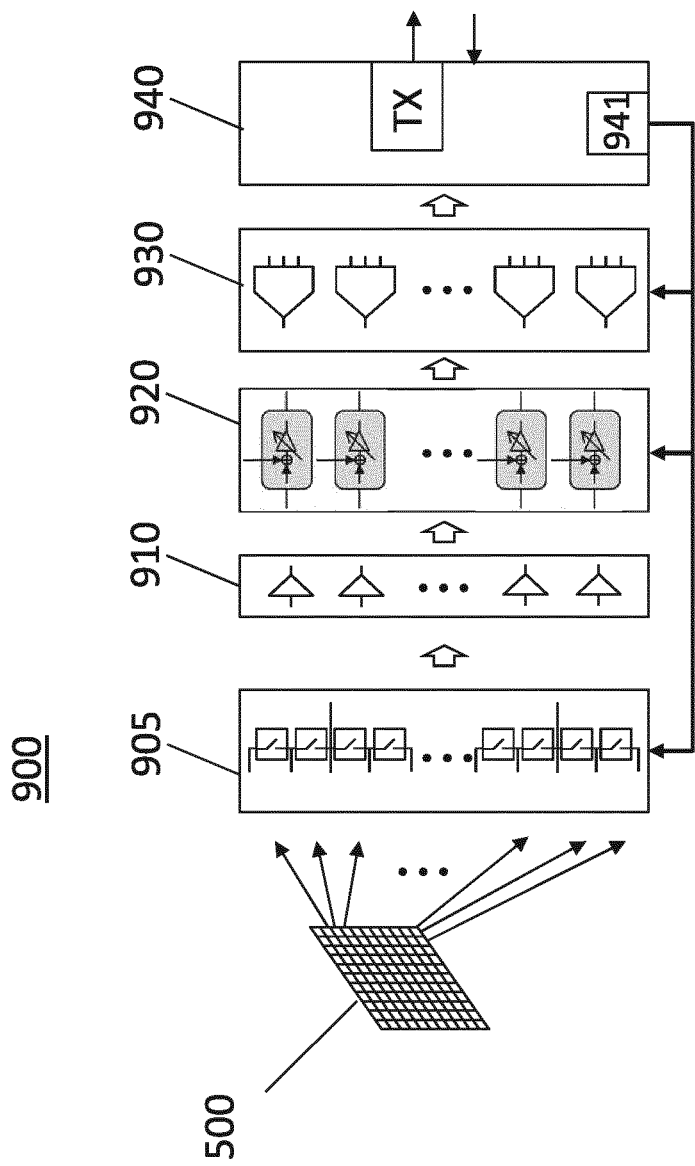
FIG. 8 is a diagram illustrating a detection system using a detector array comprising a plurality of sensing elements, consistent with embodiments of the present disclosure.

Reference is now made to FIG. 8, which illustrates a detection system 900 using a detector array comprising a plurality of sensing elements. A detector array may be provided having a detector surface 500 that can be used on electron detection device 244. The detector array may comprise J×K pixels, and have M×N outputs to be connected with a multiplexer, for example multiplexer Mux. The detector array may be constructed as a substrate including a sensor layer and a circuit layer, as discussed herein.

The detector array may be connected to a switch matrix 905. Switch matrix 905 may be an analog switch matrix comprising local pixel circuits, and having J×K inputs with and M×N outputs.

Switch matrix 905 may be connected to a signal conditioning circuit array 910. Signal conditioning circuit array 910 may have M×N inputs and outputs so as to match the output from switch matrix 905. Since switching control can be implemented in switch matrix 905, output from switch matrix 905 may be simplified. When signal conditioning circuit array 910 follows switch matrix 905, signal preconditioning occurring in signal condition circuit array can be simplified.

Signal conditioning circuit array 910 may be connected to a parallel analog signal processing path array 920 for providing gain and offset control. Parallel analog signal processing path array 920 may have M×N inputs and outputs so that signals from all groups of electron sensing elements are processed.

Parallel analog signal processing path array 920 may be connected to a parallel ADC array 930, which may have M×N inputs and outputs so that signals from all groups of electron sensing elements are digitized.

Parallel ADC array 930 may be connected to digital control unit 940. Digital control unit 940 may comprise a controller 941 which can communicate with parallel analog signal processing path array 920, parallel ADC array 930, and with switch matrix 905. Digital control unit 940 may send and receive communications from a deflection and image control (DIC) unit via a transceiver.

An external controller, such as controller 941, may be configured to execute imaging control. For example, controller 941 may be configured to generate an image of detected beamlets. Furthermore, grouping can be determined on the basis of primary and secondary beam spot boundaries.

While FIG. 8 illustrates an arrangement where switch matrix 905 precedes signal conditioning circuit array 910, it should be appreciated that this sequence could be reversed.

Switch matrix 905 may comprise a circuit layout such as that shown in circuit die 702 of FIG. 5A, or in circuit die 702 of FIG. 5B, or a similar arrangement. Switch matrix 905 provide signal strength comparison between electron sensing elements and a threshold voltage, for example Vref1. Switch matrix 905 may also provide signal strength comparison between adjacent electron sensing elements. Further, switch matrix 905 may provide analog signal selection for analog-to-digital conversion. Analog-to-digital conversion may then be implemented at parallel ADC array 930.

Switch matrix 905 may also provide, from a local digital logic circuit, signal strength status reading, such as comparisons between electron sensing elements and threshold voltage, and comparisons between electron sensing element pairs. Local switch status can be read or overwritten by external digital control circuits.

In some embodiments, switching matrix 905 can enable a simplified architecture for detection system 900. For example, reconfiguration of electron sensing elements can be implemented without an overly complex switch matrix design. The output signal of each sensing element group can go through multiple output wires connected to the group. These wires in conjunction with the connections between sensing elements in the group may form a network that largely reduces the equivalent output serial resistance and serial inductance. Accordingly, in some embodiments, output impedance of a group of pixels can be reduced dramatically.

Furthermore, since J×K pixels are initially grouped in M×N groups in the detector, the number of output may be reduced. Output from a plurality of pixels that are grouped may have a common output. For example, an arrangement having M×N outputs can be achieved. Connection nodes between the electron detector array and signal conditioning circuits (TIA) can be dramatically reduced. The total number of outputs may be largely reduced compared to conventional detector arrays. Thus, a construction which is more apt for being scaled up can be achieved. Additionally, a more practical layout can be achieved, which may reduce the risk and cost involved in developing new devices.

Furthermore, a reduced number of signal conditioning circuits may result in reduced total power consumption of an ASIC.

In addition, a trade-off relationship between pixel count and difficulties of detector array manufacture can be eliminated. For example, pixel count limit may be related to the number of contacts formed with a switch matrix. Thus, by reducing the number of contacts and output lines used, higher pixel counts can be achieved. Also, higher tolerance to individual pixel failure may be achieved.

The detector array may comprise its own memory so that the detector array can store an arrangement of the plurality of sensing elements and their associated circuitry. For example, the status of local indication 751, and the grouping of sensing elements can be stored in the memory. A state of switches can be stored in the memory.

Moreover, a switch matrix construction can be implemented with standard device processing, as would be understood to those having ordinary skill in the relevant art. Therefore, an increase in manufacturing difficulty and increased costs can be avoided.

The embodiments may further be described using the following clauses:

1. A detector comprising:
   a substrate comprising a plurality of sensing elements including a first element and a second element; and
   a switching element configured to connect the first element and the second element,
   wherein the first element is configured to generate a first signal in response to the first element detecting first charged particles that indicate a beam, and the second element is configured to generate a second signal in response to the second element detecting second charges particles that indicate the beam, and
   wherein the switching element is configured to be controlled based on the first signal and the second signal.
2. The detector of clause 1, further comprising:
   a sensor die that includes the substrate; and
   a circuit die that includes the switching element and one or more circuits configured to control the switching element.
3. The detector of any one of clauses 1 and 2, wherein the switching element comprises a switch configured to connect the first element and the second element.
4. The detector of any one of clauses 1-3, wherein the substrate comprises a diode.
5. The detector of any one of clauses 1-4, wherein
   the first element is configured to generate the first signal in response to the first element receiving first charged particles with a first predetermined amount of energy, and the second element is configured to generate the second signal in response to receiving second charged particles with a second predetermined amount of energy.
6. The detector of any one of clauses 1-4, wherein
   the first element is configured to generate the first signal in response to the first element receiving first electrons with a first predetermined amount of energy, and the second element is configured to generate the second signal in response to receiving second electrons with a second predetermined amount of energy.
7. The detector of any one of clauses 1-6, wherein
   in a thickness direction, the substrate comprises: a top metal layer configured as a detection surface, and a bottom metal layer, and
   in a cross section, an area between the top metal layer and the bottom metal layer is a charge carrier region.
8. The detector of any one of clauses 1-7, wherein the switching element comprises a field effect transistor, wherein the field effect transistor comprises at least a contact of a gate fabricated in a metal layer.
9. A detector comprising:
   a sensor layer comprising an array of sensing elements including a first element and a second element wherein the first element and the second element are adjacent;
   a circuit layer comprising one or more circuits electrically connected to the first element and the second element; and
   a switching element configured to connect the first element and the second element,
   wherein the one or more circuits is configured to:
   generate a first status indicator when the first element receives charged particles with a predetermined amount of energy,
   generate a second status indicator when the second element receives charged particles with a predetermined amount of energy, and
   control the switching element based on the first status indicator and the second status indicator.
10. The detector of clause 9, wherein the switching element comprises a transistor.
11. The detector of clause 9, wherein the circuit layer comprises the switching element.
12. The detector of any one of clauses 9 and 10, wherein in a cross section of the substrate, the sensor layer and the circuit layer sandwich the switching element.
13. A detector system, comprising
   a detector array comprising a plurality of sensing elements including a first element and a second element;
   a switching element configured to connect the first element and the second element;

one or more circuits configured to generate a first signal in response to the first element detecting first charged particles that indicate a beam, and generate a second signal in response to the second element detecting second charged particles that indicate the beam; and
a controller connected to the one or more circuits.

14. The system of clause 13, further comprising a circuit layer comprising the switching element and the one or more circuits.

15. The system of any one of clauses 13 and 14, wherein the controller is configured to control the switching element based on an address of any of the first element and the second element.

16. The system of any one of clauses 13-15, wherein
the controller is configured to acquire an image based on the beam, and generate a command signal based on the image; and
the one or more circuits are configured to control the switching element based on the command signal.

17. The system of any one of clauses 13-16, wherein
the detector array comprises a first number of pixels configured to be grouped in a second number of groups, the second number being less than the first number.

18. The system of clause 17, further comprising:
a signal conditioning circuit array;
a parallel analog signal processing path array;
a parallel analog-to-digital converter array; and
a digital control unit,
wherein the signal conditioning circuit array, the parallel analog signal processing path array, the parallel analog-to-digital converter array, and the digital control unit are connected to the detector array via a plurality of channels, a number of the plurality of channels being greater than or equal to the second number.

19. The system of any one of clauses 13-18, wherein the controller is configured to override a local logic of the one or more circuits.

20. The system of any one of clauses 13-19, wherein the one or more circuits comprise the controller.

21. The system of any one of clauses 13-19, wherein the controller is external to the detector array.

22. The system of any one of clauses 13-19, wherein the first element and the second element have a common output.

23. The system of clause 18, wherein the number of the plurality of channels is equal to the second number.

24. A detector comprising:
a substrate comprising a plurality of sensing elements including a first element and a second element; and
a switching element configured to connect the first element and the second element,
wherein the first element is configured to generate a first signal in response to the first element detecting an input, and the second element is configured to generate a second signal in response to the second element detecting an input,
wherein the switching element is configured to group together the first element and the second element.

25. The detector of clause 24, further comprising:
a first output signal path connected to the first element; and
a second output signal path connected to the second element,
wherein the switching element is configured to connect the first output signal path and the second output signal path.

26. The detector of any one of clauses 24 and 25, further comprising:
one or more circuits configured to control the switching element based on the first signal and the second signal.

27. The detector of any one of clauses 24-26, further comprising:
a circuit die comprising the switching element.

28. The detector of clause 25, further comprising:
a circuit die comprising the switching element, the first output signal path, and the second output signal path.

29. The detector of any one of clauses 24-28, wherein the detector comprises a first number of pixels configured to be grouped in a second number of groups, the second number being less than the first number.

30. The detector of any one of clauses 5 or 6, wherein the first predetermined energy and the second predetermined energy are a same predetermined energy.

31. The detector of any one of clauses 5 or 6, wherein the first predetermined energy and the second predetermined energy are different predetermined energies.

32. The detector of clause 5, wherein the charged particles are electrons.

33. The detector of clause 13, wherein the one or more circuits comprises a plurality of circuits, and wherein the controller being connected to the one or more circuits includes the controller being connected to any of the plurality of circuits.

The block diagrams in the Figures illustrate the architecture, functionality, and operation of possible implementations of systems, methods, and computer hardware/software products according to various exemplary embodiments of the present disclosure. In this regard, each block in a flowchart or block diagram may represent a module, segment, or portion of code which comprises one or more executable instructions for implementing the specified logical functions. It should be understood that in some alternative implementations, functions indicated in the block may occur out of the order noted in the Figures. For example, two blocks shown in succession may be executed or implemented substantially concurrently, or two blocks may sometimes be executed in reverse order, depending upon the functionality involved. It should also be understood that each block of the block diagrams, and combination of the blocks, can be implemented by special purpose hardware-based systems that perform the specified functions or acts, or by combinations of special purpose hardware and computer instructions.

It will be appreciated that the present invention is not limited to the exact construction that has been described above and illustrated in the accompanying drawings, and that various modifications and changes can be made without departing from the scope thereof. For example, while an exemplary detector has been set forth and described with respect to an electron beam system, a detector consistent with aspects of the present disclosure may be applied in a photo detector system, x-ray detector system, and other detection systems for high energy ionizing particles, etc. Detectors according to aspects of the present disclosure may be applied in a scanning electron microscope (SEM), a CMOS image sensor, a consumer camera, a specialized camera, or industry-use camera, etc.

It is intended that the scope of the invention should only be limited by the appended claims.

The invention claimed is:
1. A charged particle detector comprising:
a substrate comprising a plurality of sensing elements including a first element and a second element; and a switching element configured to connect the first element and the second element, wherein the first element is configured to generate a first signal in response to the first element detecting a first charged particle input of a charged particle beam spot, and the second element is configured to generate a second signal in response to the second element detecting a second charged particle input of the charged particle beam spot, and wherein the switching element is configured to group together the first element and the second element so as to associate the first element and the second element with the charged particle beam spot.

2. The detector of claim 1, further comprising:
a first output signal path connected to the first element; and
a second output signal path connected to the second element,
wherein the switching element is configured to connect the first output signal path and the second output signal path.

3. The detector of claim 2, further comprising:
a circuit die comprising the switching element, the first output signal path, and the second output signal path.

4. The detector of claim 1, further comprising:
a circuit configured to control the switching element based on the first signal and the second signal.

5. The detector of claim 1, further comprising:
a circuit die comprising the switching element.

6. The detector of claim 1, wherein the detector comprises a first number of pixels configured to be grouped in a second number of groups, the second number being less than the first number.

7. The detector of claim 1, wherein the first charged particle input comprises an electric signal generated in response to at least one first charged particle landing event, and wherein the second charged particle input comprises an electric signal generated in response to at least one second charged particle landing event.

8. The detector of claim 1, further comprising a combined output path configured to output a merged signal from the first element and the second element that represents the charged particle beam spot when the switching element groups together the first element and the second element.

9. The detector of claim 1, further comprising a circuit configured to determine that the first element or the second element is within a beam spot boundary.

10. The detector of claim 1, wherein the first element and the second element are adjacent.

11. A detector system, comprising
a detector array comprising a plurality of sensing elements including a first element and a second element;
a switching element configured to connect the first element and the second element;
a circuit configured to generate a first signal in response to the first element detecting first charged particles that indicate a beam, and generate a second signal in response to the second element detecting second charged particles that indicate the beam; and
a controller connected to the circuit.

12. The system of claim 11, further comprising a circuit layer comprising the switching element and the circuit.

13. The system of claim 11, wherein
the controller is configured to control the switching element based on an address of any of the first element and the second element.

14. The system of claim 11, wherein
the controller is configured to acquire an image based on the beam, and generate a command signal based on the image; and
the circuit is configured to control the switching element based on the command signal.

15. The system of claim 11, wherein
the detector array comprises a first number of pixels configured to be grouped in a second number of groups, the second number being less than the first number.

16. The system of claim 15, further comprising:
a signal conditioning circuit array;
a parallel analog signal processing path array;
a parallel analog-to-digital converter array; and
a digital control unit,
wherein the signal conditioning circuit array, the parallel analog signal processing path array, the parallel analog-to-digital converter array, and the digital control unit are connected to the detector array via a plurality of channels, a number of the plurality of channels being greater than or equal to the second number.

17. The system of claim 11, wherein the controller is configured to override logic of the circuit.

18. The system of claim 11, wherein the circuit comprises the controller, wherein the circuit comprises a plurality of circuits, wherein the circuit comprising the controller includes any of the plurality of circuits comprising the controller, and wherein the controller being connected to the circuit includes any of the plurality of circuits that comprise the controller being connected to any of the plurality of circuits that comprise the circuit.

19. The system of claim 11, wherein the controller is configured to determine that the first element or the second element is within a beam spot boundary.

20. The system of claim 11, wherein the controller is configured to group together the first element and the second element so as to associate the first element and the second element with the beam.

* * * * *